United States Patent
Franke

(10) Patent No.: US 7,463,990 B2
(45) Date of Patent: Dec. 9, 2008

(54) METHOD FOR ADJUSTING AN ELECTRONIC SYSTEM

(75) Inventor: Reiner Franke, Velbert (DE)

(73) Assignee: Atmel Duisburg GmbH, Duisburg (DE)

( * ) Notice: Subject to any disclaimer, the term of this patent is extended or adjusted under 35 U.S.C. 154(b) by 0 days.

(21) Appl. No.: 11/882,269

(22) Filed: Jul. 31, 2007

(65) Prior Publication Data

US 2008/0052031 A1 Feb. 28, 2008

Related U.S. Application Data

(60) Provisional application No. 60/834,172, filed on Jul. 31, 2006.

(30) Foreign Application Priority Data

Dec. 6, 2006 (DE) ............. 10 2006 057 517

(51) Int. Cl.
*G01D 18/00* (2006.01)
*G01D 21/00* (2006.01)
*G01R 35/00* (2006.01)
*G06F 17/10* (2006.01)

(52) U.S. Cl. ............. 702/85; 702/5; 702/107; 708/308

(58) Field of Classification Search ............. 702/85, 702/5; 708/308
See application file for complete search history.

(56) References Cited

U.S. PATENT DOCUMENTS 5,402,367 A * 3/1995 Sullivan et al. ............. 703/6
5,428,712 A * 6/1995 Elad et al. ............. 706/46
2003/0130975 A1* 7/2003 Muller ............. 706/50
2005/0148304 A1 7/2005 Jerng
2006/0064670 A1* 3/2006 Linebarger et al. ............. 717/106

* cited by examiner

*Primary Examiner*—Eliseo Ramos Feliciano
*Assistant Examiner*—Janet L Suglo
(74) *Attorney, Agent, or Firm*—Muncy, Geissler, Olds & Lowe, PLLC

(57) ABSTRACT

A method for adjusting an electronic system is provided in which it is possible to predefine the n parameters of the system which correspond to an n-dimensional adjustment space, wherein at the start of the adjustment each parameter has predefined for it two limit values that delimit an appropriate initial range in the n-dimensional adjustment space, and wherein the following steps are repeated until a termination condition is achieved: evaluating a target function that quantifies the achievement of an adjustment target for the limit values that delimit the initial range, wherein the evaluation includes the measurement and/or evaluation of at least one physical quantity of the system that is a function of the specific parameter or its limit value, and wherein appropriate target function values associated with the limit values are obtained, defining a modified, in particular reduced, initial range for a subsequent iteration as a function of the target function values obtained. According to the invention, the target function values are assigned to two different classes, wherein all target function values that correspond to a target criterion are assigned to a first class, and wherein all target values that do not correspond to the target criterion are assigned to a second class, and in that defining of the modified initial range for the subsequent iteration takes place as a function of the target function values assigned to the first class.

11 Claims, 4 Drawing Sheets

METHOD FOR ADJUSTING AN ELECTRONIC SYSTEM

This nonprovisional application claims priority to German Patent Application No. DE 102006057517, which was filed in Germany on Dec. 6, 2006, and to U.S. Provisional Application No. 60/834,172, which was filed on Jul. 31, 2006, and which are both herein incorporated by reference.

BACKGROUND OF THE INVENTION

1. Field of the Invention

The present invention relates to a method for adjusting an electronic system in which it is possible to predefine the n parameters of the system which correspond to an n-dimensional adjustment space, wherein at the start of the adjustment each parameter has predefined for it two limit values that delimit an initial range in the n-dimensional adjustment space, and wherein the following steps are repeated until a termination condition is achieved: evaluating a target function that quantifies the achievement of an adjustment target for the limit values that delimit the adjustment space, wherein the evaluation includes the measurement and/or evaluation of at least one physical quantity of the system that is a function of the specific parameter or its limit value, and wherein appropriate target function values associated with the limit values are obtained; and defining a modified, in particular reduced, initial range for a subsequent iteration as a function of the target function values obtained.

2. Description of the Background Art

Adjustment methods of this type are known. For example, adjustment methods that use the binary search principle reduce the initial range for a subsequent iteration by half at each iteration, wherein, e.g. in a one-dimensional adjustment space with one parameter, an initial range for the next iteration is assigned the limit value whose target function value is closer to the adjustment target.

This method has the disadvantage that with target value functions that are subject to error, such as those that are typically obtained from the measurement of a physical quantity of the system, erroneous decisions can be made regarding the assignment of the initial range for the subsequent iteration, leading to a suboptimal adjustment. In an especially disadvantageous manner, a measurement error can arise, e.g. during the generation of the target function values, such that the actual target function value associated with one limit value may be further away from the adjustment target to be reached than a target function value associated with a different limit value. As a result of this, the prior art method makes an incorrect decision regarding the further evaluation of the adjustment space and the definition of the initial range; in some cases, this error prevents subsequent iterations from more closely approaching the adjustment target that is to be achieved.

Other known adjustment methods provide for the systematic evaluation of all possible parameter values in the entire adjustment space, which in principle increases error tolerance. However, even with a discretization of two parameters with 8 bits each, an adjustment space containing $2^{16}=65,536$ adjustment points must be examined. Such an effort cannot be tolerated in most systems to be adjusted, one of the reasons being the non-negligible length of time required for acquiring and evaluating the physical quantities.

SUMMARY OF THE INVENTION

It is therefore an object of the present invention to provide an adjustment method such that the adjustment target can be reached reliably and quickly, even in the presence of measurement errors.

This object is attained in accordance with the invention in a method in that the target function values are assigned to two different classes, wherein all target function values that correspond to a target criterion are assigned to a first class, and wherein all target values that do not correspond to the target criterion are assigned to a second class, and in that defining of the modified initial range for the subsequent iteration takes place as a function of the target function values assigned to the first class.

The inventive classification of the target function values makes it possible, instead of using the single presumed best target function value that is used by itself in the prior art method to define the new initial range, to examine multiple target function values and thus avoid incorrect decisions caused by, e.g., measurement errors, regarding the new initial range to be defined, or to reduce their effects. As a result of the inventive examination of multiple target function values contained in the first class, a more precise definition of the initial range for the subsequent iteration is possible than was the case in the prior art method. At the same time, the inventive adjustment method advantageously results in optimal adjustment values with a minimal number of adjustment steps in spite of its error tolerance.

In an embodiment of the inventive method, provision is made that a threshold value for the target function values is used as the target criterion. In this way the target function values belonging to the first class can be identified by testing whether they fall above or below the predefinable threshold value. The error tolerance of the inventive adjustment method can thus be set by suitable selection of the threshold value; this can also be done dynamically, for example, i.e. during an adjustment process. For example, a first threshold can be set during a first number of iterations, and a second threshold is used for a second number of iterations, and so on.

For example, if the threshold is chosen such that at least two target function values are always assigned to the first class, then a measurement error in one of these two target function values has a less unfavorable effect on further adjustment in the inventive method than in the prior art method. In the prior art method, such an error would result in the selection or definition of a completely incorrect new initial range for the subsequent iteration, while the initial range in the inventive method is also produced as a function of the target function value, which is not affected by such a measurement error, thus avoiding, at a minimum, a completely incorrect new initial range. On the whole, the error tolerance of the inventive method is increased by the means that a measurement error must be greater than the threshold value for an incorrect decision to be made concerning the modified initial range.

In another embodiment of the inventive method, provision is made that the modified initial range for the subsequent iteration is chosen such that it is closer to every limit value that is associated with a target function value in the first class than to a limit value that is associated with a target function value in the second class. This means advantageously ensures that in the subsequent iteration, only the regions of the adjustment space that lie in the vicinity of limit values whose target function values are sufficiently close to the adjustment target that is to be reached will be examined, while those regions that lie in the vicinity of limit values whose target function values are not sufficiently close to the adjustment target that is to be reached will be considered to a lesser degree or not at all.

In yet another embodiment of the inventive method, provision is made that the initial range or a modified initial range have the same length in each dimension. In this way a systematic examination of the adjustment space is possible in an especially efficient manner, wherein the adjustment space is divided, e.g., into square initial regions in the case of two parameters.

Further provision is made in that the length of the modified initial range in each of the n dimensions preferably corresponds to half the length of the initial range of the preceding iteration. Alternatively, other guidelines for producing the initial range for a subsequent iteration are also possible, which do not provide for halving of the length in question, for example.

In another embodiment of the inventive method, provision is made that the termination condition, upon the attainment of which the inventive adjustment method is terminated, depends on a measurement accuracy in the measurement of the physical quantity and/or on the number of iterations performed and/or on the size of the current initial range. Since the inventive step of evaluating to determine the target function values includes the measurement and/or evaluation of at least one physical quantity of the system, it is most especially advantageous to terminate the inventive adjustment method when the target function values determined differ from one another or from the adjustment target by only an amount that is approximately on the order of magnitude of the possible processing accuracy in the evaluation. A conventionally known measurement accuracy can also advantageously be used in order to avoid performing an unnecessarily large number of adjustment steps.

The inventive adjustment method can be used generally for any electronic system that has one or more parameters and that includes the measurement and/or evaluation of physical quantities to determine the achievement of an adjustment target. For example, the inventive adjustment method can be used to particular advantage to adjust an up-converter with regard to an undesirable residual carrier, wherein it is possible to specify two parameters of the up-converter that affect the application of two input signals to the up-converter, preferably an in-phase component and a quadrature component, with an offset. Accordingly, the remaining residual carrier of the up-converter is used as the target function and is measured in a manner known per se, by which means one obtains the aforementioned target function values that specify how well the adjustment target has been reached so far.

The inventive adjustment method is not limited to adjusting a system having two parameters. Three- or four-dimensional adjustment spaces can also be searched systematically and, to particular advantage, in a fault-tolerant manner, using the inventive adjustment method, wherein optimal adjustment values are always obtained in a minimum number of iterations.

In further aspect of the present invention, an electronic system that is configured to perform the inventive method is specified. Such a system can have a dedicated control unit for performing the method, for example. Preferably, the inventive functionality can also be implemented in an already-present control unit of an existing electronic system, in which the conventional adjustment was previously employed, for example.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
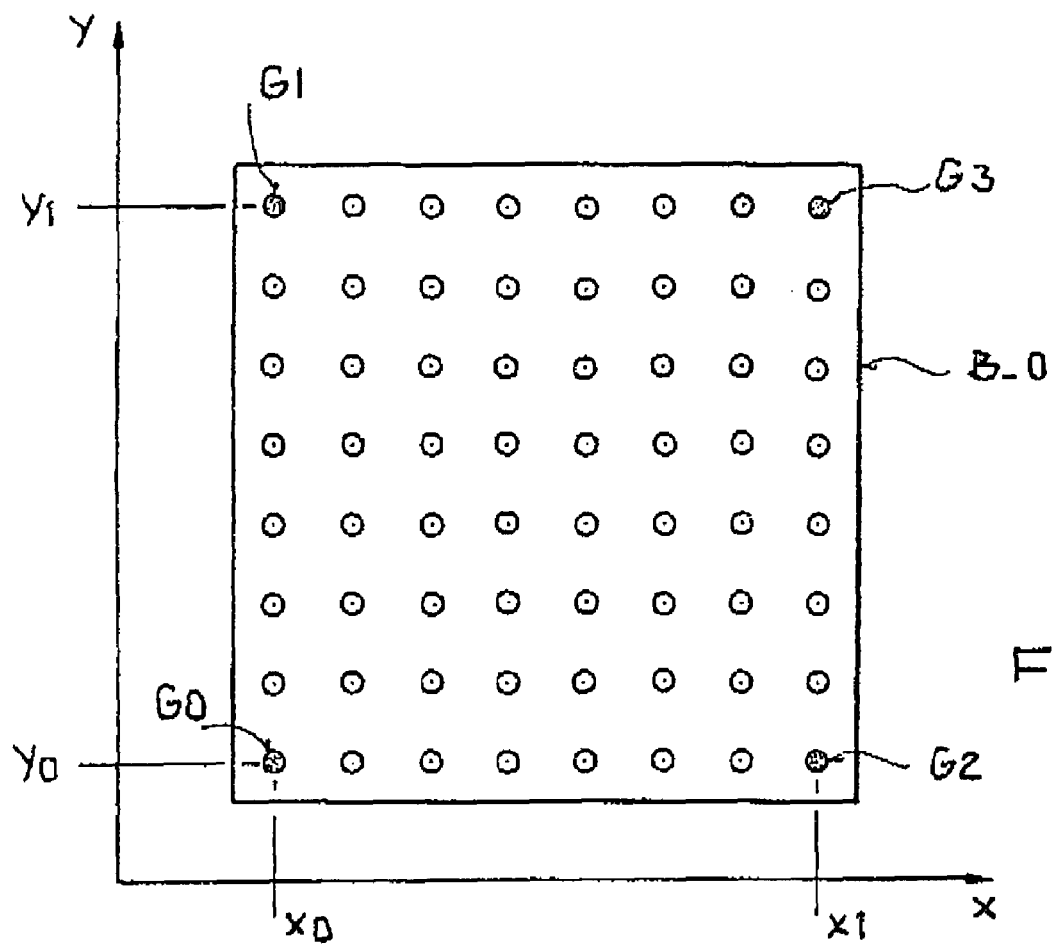
FIG. 1a illustrates an initial range for performing a first iteration of the inventive adjustment method in a two-dimensional adjustment space.

FIG. 1a schematically shows a section of a two-dimensional parameter space that is spanned by the parameters x, y. The parameters x, y are quantities that affect the operation of the electronic system 200 schematically shown in FIG. 4 and which are to be adjusted using the inventive adjustment method in order to ensure an optimal operation of the electronic system 200.

Figure 4:
FIG. 4 is a simplified block diagram of an inventive electronic system.

In the present case, the electronic system 200 is represented by an up-converter to which two input signals, not shown in FIG. 4, are supplied, and which processes the input signals in a manner known per se. In this process, asymmetries cause the appearance at the output of the up-converter 200 of an unwanted residual carrier that can be influenced by means of the parameters x, y. In the present example, the parameters x, y represent quantities that are used for offset adjustment of the input signals of the up-converter 200 and are accordingly added to the input signals in order to compensate for the aforementioned asymmetries.

A particular combination of parameters x, y results in a minimum residual carrier, which corresponds to the adjustment target that is to be reached. Thus the residual carrier, which is determined in a manner known per se, or a quantity representing the residual carrier, represents a target function depending on the parameters x, y, by means of which the attainment of the adjustment goal of the minimum residual carrier can be quantified.

At the start of the adjustment method, two limit values x0, x1, y0, y1 are predefined for each parameter x, y; in the present two-dimensional adjustment space, these limit values delimit an appropriate initial range B_0, which is represented in FIG. 1a by a rectangle.

The adjustment that follows determines those value combinations for the parameters x, y located within the initial range for which a minimum residual carrier is obtained at the output of the up-converter 200 (FIG. 4).

Since the parameters x, y are preferably present in digital form with a bit width of, e.g., 3 bits each in order to use the inventive adjustment method, as shown in FIG. 1a a region results there with a total of 64 possible "adjustment vectors" for achieving the adjustment target, wherein a first component of the adjustment vectors is represented by the parameter x and a second component of the adjustment vectors is represented by the parameter y. With a discretization of the adjustment space to be searched that is finer than that described here by way of example, and with a larger initial range B_0, there will be a correspondingly larger number of parameter values to examine.

Figure 2:
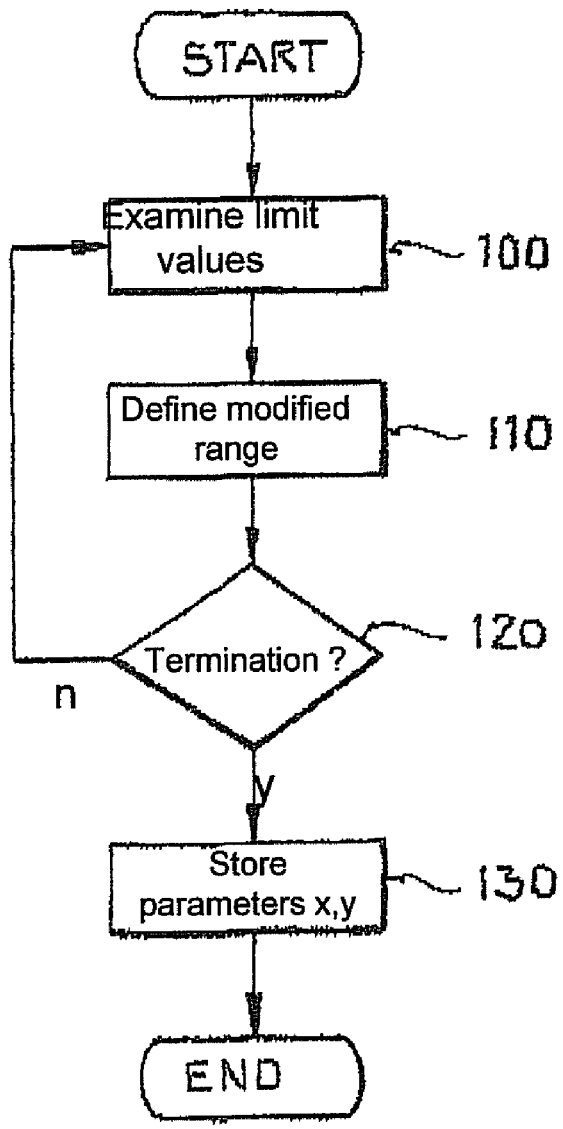
FIG. 2 is a simplified flow diagram of an embodiment of the inventive adjustment method.

In a first step 100 of the inventive method that is illustrated by the flow diagram in FIG. 2, the limit values x0, x1, y0, y1 delimiting the initial range are first examined with regard to achieving the adjustment target. In this process, the aforementioned target function is evaluated for each of the limit values x0, x1, y0, y1 or for corresponding limit points $G0(x_0, y_0)$, $G1(x_0, y_1)$, G2, G3, wherein the target function values obtained are associated with the respective limit values.

The evaluation of the target function is performed by appropriately setting the parameters x, y to the respective limit values and measuring or examining the output signal of the up-converter 200 (FIG. 4), by which means the corresponding target function values are ultimately obtained. In other words, for each limit point G0, G1, G2, G3 of the initial range B_0 that is first examined, a target function value is present in step 100 which specifies a remaining residual carrier for the applicable parameter values.

After this evaluation of the target function for all four limit points G0, G1, G2, G3, the target function values obtained in this process are assigned to two different classes in accordance with the invention. To this end, a target criterion is defined, which is preferably a threshold value for the target function values. For example, all the target function values that are no farther than the predefinable threshold value from the best target function value, i.e. the target function value that comes closest to the adjustment target, are assigned to the first class. In this way, multiple target function values are typically assigned to the first class, all of which correspond in a comparable manner to an approach to the adjustment target, while those target function values that deviate from the best target function value by more than the threshold are assigned to the second class.

Next, in a further step 110 of the inventive method, a modified initial range is defined for a next iteration. According to the invention, this definition is advantageously performed as a function of those target function values that are assigned to the first class and that are correspondingly closer to the adjustment target than those target function values that are in the second class.

In the present example, the evaluation in step 100, FIG. 2, has produced the result that the limit points G0, G1 corresponding to parameter or limit values x0, y0 and x1, y1 are in the first class. Accordingly, the initial range B_1 for a subsequent iteration of the inventive method (see FIG. 1b) is advantageously chosen such that it is closer to the limit points G0, G1 that are assigned to the first class than to those limit points G2, G3 that are in the second class.

Figure 1B:
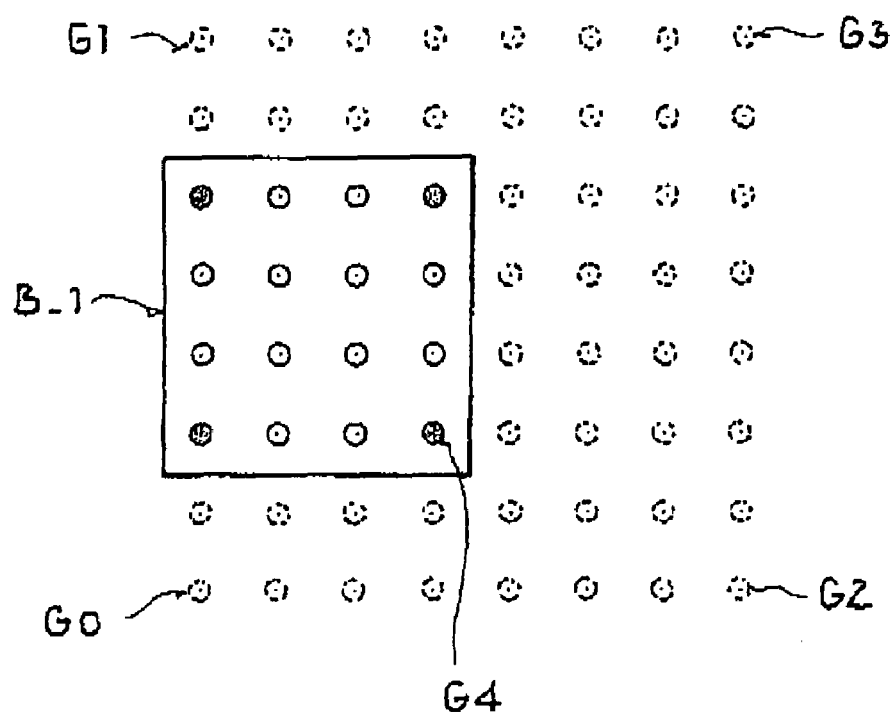
FIG. 1b illustrates an initial range for another iteration of the inventive adjustment method.

As can be seen in FIG. 1b, the new parameter values and associated limit points corresponding to the modified initial range B_1 are chosen appropriately; see also the filled-in circles in the corners of the initial range B_1. For improved clarity, the other points of the adjustment space that are contained in the initial range B_1 are symbolized by hollow circles, while the remaining points in the initial range B_0 examined in the previous iteration are indicated by dashed circles.

As a result of the inventive classification of the target function values and the taking into account of all target function values contained in the first class, or the limit values of the parameters x, y associated therewith or the limit points, the inventive adjustment method is fault-tolerant. Namely, in a prior art method wherein only the target function value closest to the adjustment target is used to determine the position of a subsequent initial range, obtaining an incorrect target function value for the limit point G0 during step 100 of the evaluation, for example as a result of a measurement error in determining the corresponding target function values, would result in the incorrect setting of the modified adjustment range B_1. In contrast to this, the inventive method makes it possible to simultaneously take into account multiple relatively "good" parameter or limit values or limit points whose target function values are sufficiently close to the adjustment target that is to be achieved. By this means, the risk of completely incorrect assignment of the modified initial range B_1 as a result of a measurement error is averted. Instead, the modified initial range B_1 is arranged according to the invention such that it lies in the vicinity of the two promising limit points G0, G1 in the first class, so that even in the event of an incorrect assignment of a limit point the placement of the modified initial range B_1 is not completely incorrect.

Figure 1C:
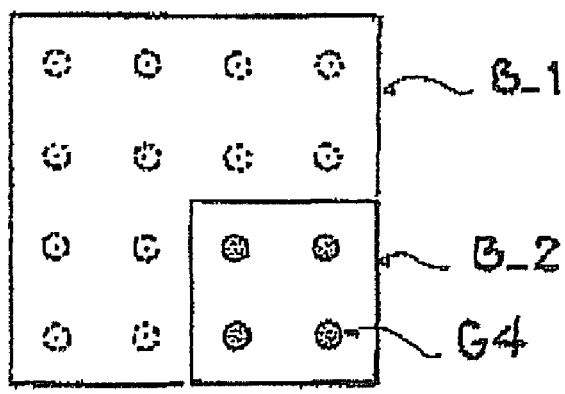
FIG. 1c illustrates an initial range for a third iteration of the inventive adjustment method.

In the next step 120 of the inventive method (see FIG. 2), a test is performed to determine whether a termination condition for the inventive adjustment method has been reached, and if this is not the case, the steps 100, 110 are repeated in a next iteration. In this process, as can be seen in FIG. 1c, for example, a new modified initial range B_2 is obtained that is largely in the vicinity of the limit point G4, because only the limit point G4 or a target function value associated therewith has satisfied the required target criterion in the steps 100, 110 of the following iteration and belongs to the first class.

However, in the event that it is determined in step 120 that the termination criterion is met, the inventive method is terminated, and it can be assumed that the parameters x, y, or the corresponding target function values discovered in the process, are sufficiently close to the adjustment target to be attained. In other words, for the present electronic system 200 embodied as an up-converter (see FIG. 4), it can be assumed that the best possible offset adjustment is obtained using the parameters x, y that have been found, and that the unwanted residual carrier is correspondingly minimized. These parameters x, y are stored during step 130 (FIG. 2) of the inventive method so as to be available for future use.

The termination criterion for the query 120 can be selected as, for example, a function of a measurement accuracy with which the target function values can be determined. As soon as the different limit values, or target function values associated with limit values, that are to be examined during the evaluation 100 differ only by amounts on the order of the measurement accuracy in the measurement of the residual carrier or other physical quantities, a continued search in the adjustment space serves no purpose, and the parameter values already found are stored as optimal parameter values, step 130, and are used for further operation of the up-converter 200.

The absolute count of the iterations carried out during the inventive adjustment method can also be used to determine the termination condition, ensuring that the inventive method does not exceed a predefinable maximum number of iterations. The remaining quantity or number of discrete parameter values of an initial range B_1 can also enter into the determination of the termination criterion.

In especially advantageous manner, the initial range B_0, B_1, B_2 can have the same length in each dimension; in the example described above on the basis of FIGS. 1a through 1c, this results in rectangular initial ranges B0, B1, B2. Such a design of the initial ranges permits a systematic examination of the adjustment space in an especially simple manner.

It is also very advantageous to select the lengths of the modified initial ranges B_1, B_2, preferably in each of the n dimensions, such that they correspond to half the length of the initial range B_0 in the previous iteration.

Although the above example uses the two parameters x, y and correspondingly has a two-dimensional adjustment space, the inventive adjustment method is not limited to two-dimensional adjustment spaces. It is equally possible to examine adjustment spaces having three or more dimensions and a corresponding number of parameters; the same applies to one-dimensional adjustment spaces. In each case, the inventive classification of the target function values associated with the limit values or limit points provides for a fault-tolerant search for optimal adjustment parameters that—like the binary search principle—results in optimal adjustment values in a minimal number of iterations.

FIGS. 3a through 3e—again using a two-dimensional adjustment space—symbolize various cases that can arise in the inventive evaluation of the target functions or classification of corresponding target function values and in the formation of modified initial ranges B_1. In each case here, the dashed square B_0 represents an initial range for the first iteration of the inventive method, and a square B_1 enclosed with a solid line represents the modified initial range for the next iteration of the inventive adjustment method, which has been determined according to the invention as a function of the corresponding limit values or limit points.

Figure 3:
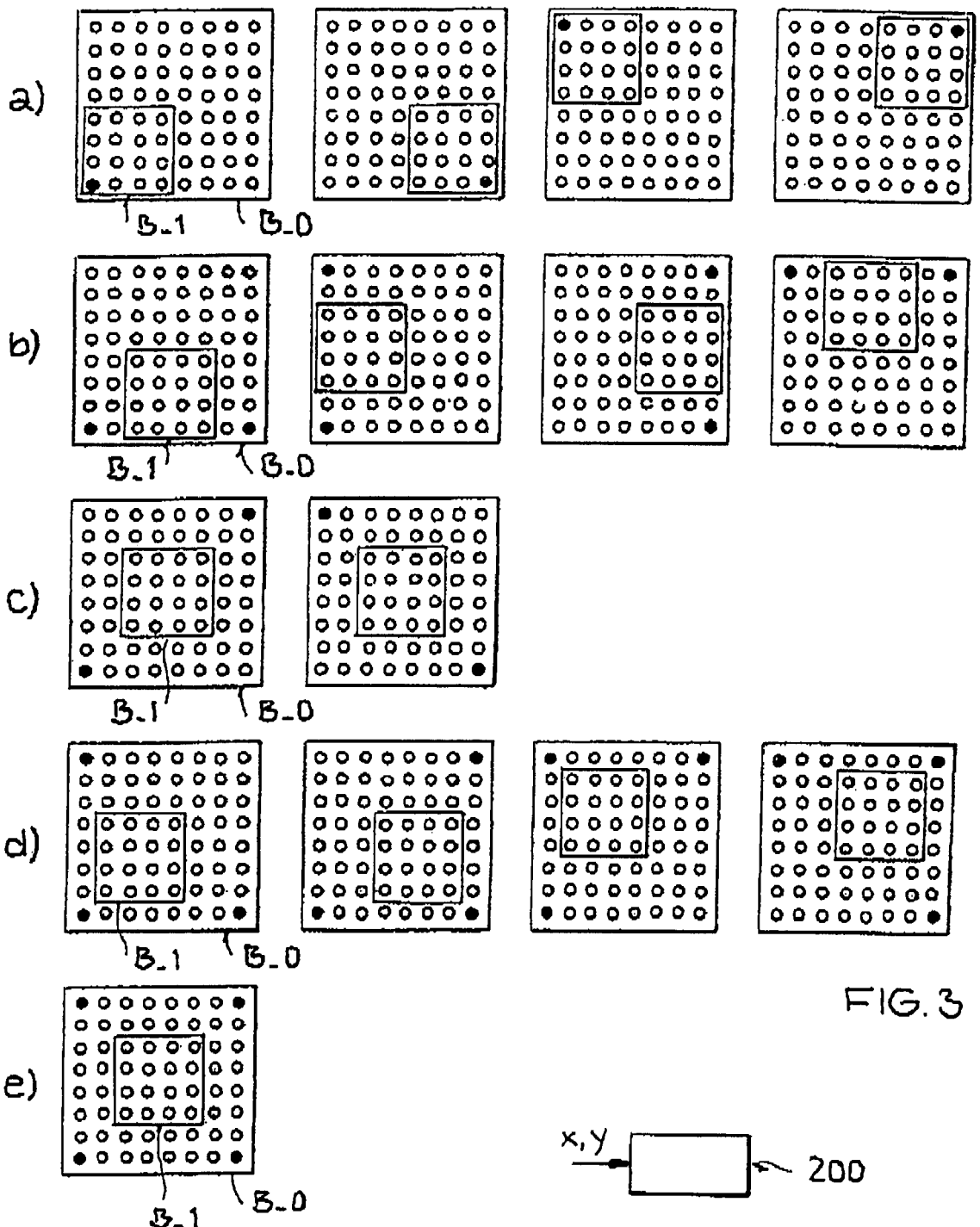
FIGS. 3a-3e illustrate additional possible initial ranges during the execution of an inventive adjustment method.

FIG. 3a shows all four cases; in each case, only one of the four limit points delimiting the initial range B_0, or the corresponding target function value, is assigned to the first class. The limit point in question here is always symbolized by a black filled-in circle, while the points of the initial range B_1 corresponding to the remaining parameter values are symbolized by hollow circles. Accordingly, the modified initial range B_1 is located as close as possible to the limit point in question in accordance with the invention.

FIG. 3b shows those cases where the classification of the target function values has the result that the first class contains exactly two target function values that correspond to adjacent limit points, i.e. that are located on the same side of the initial range B_0. Accordingly, the modified initial ranges B_1 are in each case arranged according to the invention such that they are located closer to these limit points.

For the two cases shown in FIG. 3c, the first class contains limit points or their target function values that are located opposite one another within the initial range B_0, which preferably results in a centered arrangement of the modified initial range B_1 within the initial range B_0, as can be seen from FIG. 3c.

For the cases shown in FIG. 3d, the first class contains three out of four limit points or their target function values that delimit the initial range B_0, so that the modified initial range B_1 is located near these three limit points in accordance with the invention.

In the situation symbolized in FIG. 3e, all four target function values of the limit points delimiting the initial range B_0 are in the first class, and the arrangement of the modified initial range B_1 is correspondingly centered relative to the initial range B_0 from the previous iteration (see also FIG. 3c).

The definition of modified initial range B_1 for a subsequent iteration advantageously takes place according to the principle described above, that the modified initial range B_1 is always preferably located closer to limit points whose target function values are assigned to the first class. However, the exact selection of the limit values or points for the modified initial range B_1, and its shape and/or size, can be modified in almost any desired manner and adapted to the conditions prevailing in each case. However, the use of initial ranges B_0, B_1, B_2 with equal lengths in each dimension and a halving of these lengths from iteration to iteration are preferred, particularly on account of the favorable implementation in a computing or control unit 300 (FIG. 5) carrying out the inventive adjustment method.

Because of the fault tolerance of the inventive method, the measurement and evaluation of the physical quantity, as e.g., the residual carrier of the up-converter 200 in FIG. 4, can advantageously be performed with reduced accuracy in the same number of iterations as in the case of the binary search principle, so that a corresponding effort is reduced and the duration of the adjustment method can be shortened without having to do without the optimal adjustment values.

Figure 5:
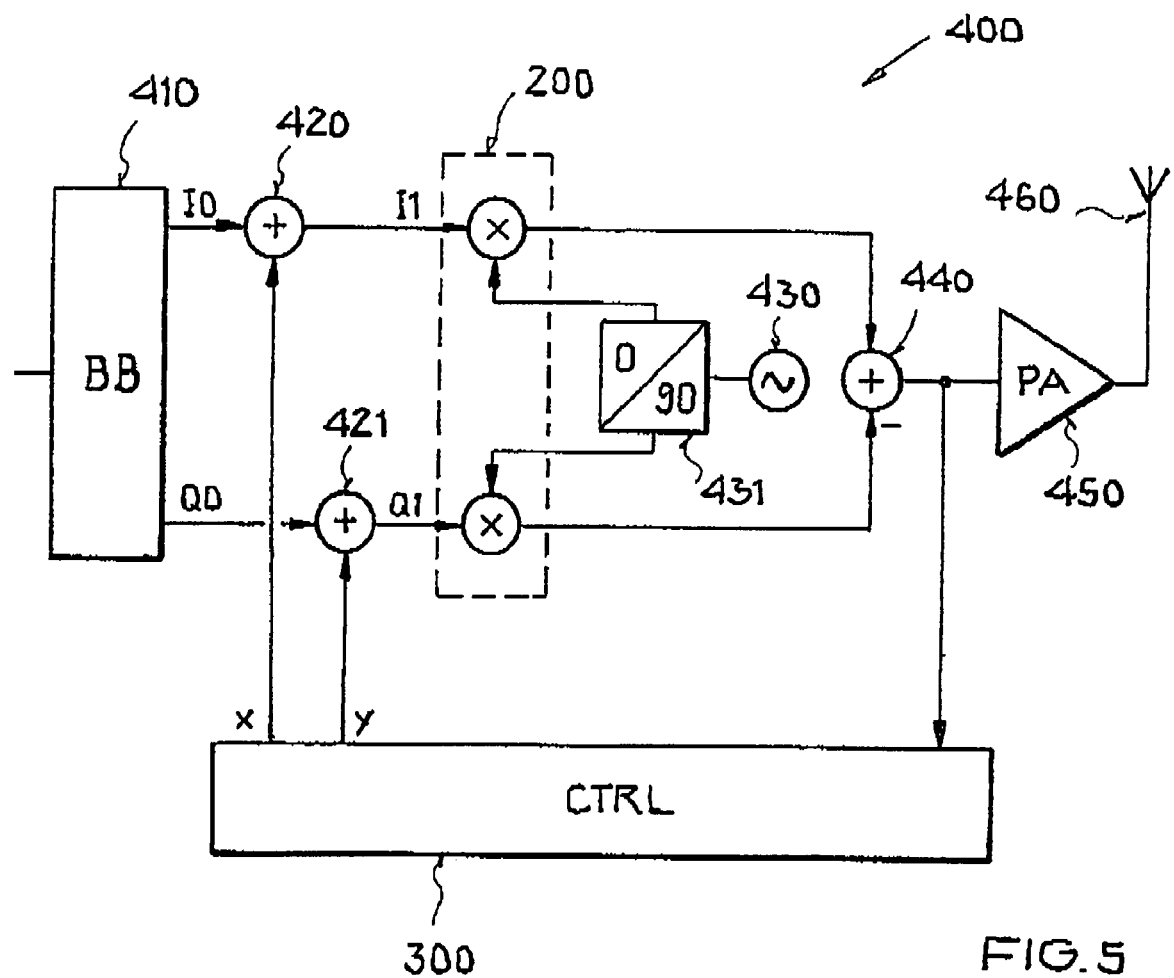
FIG. 5 is a simplified block diagram of a transmitting/receiving unit.

FIG. 5 shows a simplified block diagram of a transmitting/receiving unit for a data transmission system according to IEEE 802.16 (WiMax) having an up-converter 200 that is adjusted by the inventive method.

The transmitting/receiving unit 400 has a baseband unit (BB) 410, addition nodes 420, 421, an up-converter 200, an oscillator 430, a quadrature generator 431, a subtraction node 440, a power amplifier (PA) 450, an antenna 460 and a control unit (CTRL) 300.

The baseband unit (BB) 410 provides a complex-valued signal with an in-phase component 10 and a quadrature component Q0, which is to be transmitted with the least possible distortion. The addition nodes 420 and 421 add the parameters x and y, provided by the control unit 300 for offset adjustment, to the respective signals 10 and Q0, thus producing the input signals I1 and Q1 of the up-converter 200.

The oscillator 430 provides a local oscillator signal from which the quadrature generator 431 derives an in-phase component (0) and a quadrature component (90) of the local oscillator signal.

The up-converter 200 mixes the input signals I1, Q1 with the in-phase component (0) and the quadrature component (90) of the local oscillator signal, producing the output signal by subtracting the two resulting signals from one another in the subtraction node 440.

The transmit signal thus produced is finally amplified by the power amplifier (PA) 450 and is radiated through the antenna 460.

The control unit 300 (and thus the transmitting/receiving unit 400, or the electronic system) is designed to perform the inventive method. To this end, it evaluates the output signal of the subtraction node 440, derives parameter values x, y therefrom, and applies these parameters to the input signals of the up-converter 200 until the up-converter 200 is adjusted in the course of the aforementioned iterative method.

In additional embodiments, a rotation stretching of the input signals of the up-converter can also be undertaken with two parameters x, y.

Naturally, the invention can also be advantageously used in transmitting/receiving units that are specified according to other data transmission standards.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for adjusting an electronic system in which n parameters of the system are predefined that correspond to an n-dimensional adjustment space, wherein at the start of the adjustment each parameter has two limit values predefined that delimit an appropriate initial range in the n-dimensional adjustment space, and wherein the following steps are repeated until a termination condition is achieved:

evaluating a target function that quantifies the achievement of an adjustment target for the limit values that delimit the initial range, wherein the evaluation includes at least one of measurement and evaluation of at least one physical quantity of the system that depends on limit values of specific ones of said parameters, and wherein appropriate target function values associated with the limit values are obtained; and defining a modified reduced initial range for a subsequent iteration as a function of the target function values obtained, wherein the target function values are assigned to two different classes, wherein all target function values that correspond to a target criterion are assigned to a first class, wherein all target values that do not correspond to the target criterion are assigned to a second class, wherein the step of defining the modified initial range for the subsequent iteration takes place as a function of the target function values assigned to the first class; and wherein said termination condition occurs when a predefined relationship to said target function values is determined.

2. The method according to claim 1, wherein a threshold value for the target function values is used as the target criterion.

3. The method according to claim 1, wherein the modified initial range for the subsequent iteration is chosen such that it is closer to every limit value that is associated with a target function value in the first class than to a limit value that is associated with a target function value in the second class.

4. The method according to claim 1, wherein the initial range or a modified initial range have substantially the same length in each dimension.

5. The method according to claim 1, wherein the length of the modified initial range in each of the n dimensions corresponds to half the length of the initial range of the preceding iteration.

6. The method according to claim 1, wherein a termination condition depends on a measurement accuracy in the measurement of at least one of the physical quantity and the number of iterations and the size of the current initial range.

7. The method according to claim 1, wherein the electronic system is designed as an up-converter, wherein two parameters are specified, wherein the two parameters affect the application of two input signals to the up-converter, preferably an in-phase component and a quadrature component, with an offset.

8. The method according to claim 1, wherein at least two parameters are specified that correspond to a two-dimensional adjustment space.

9. An electronic system that is configured to carry out the method according to claim 1.

10. The electronic system according to claim 9, wherein a control unit is provided, which is designed to perform the method according to claim 1.

11. The electronic system according to claim 10, wherein an up-converter is provided and the control unit is designed to specify two parameters that affect the application of two input signals to the up-converter, preferably an in-phase component and a quadrature component, with an offset.

* * * * *